US011500021B2

(12) United States Patent
Vincenzoni

(10) Patent No.: US 11,500,021 B2
(45) Date of Patent: Nov. 15, 2022

(54) METHOD OF TESTING ELECTRONIC CIRCUITS AND CORRESPONDING CIRCUIT

(71) Applicant: STMicroelectronics S.r.l., Agrate Brianza (IT)

(72) Inventor: David Vincenzoni, Usmate Velate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 21 days.

(21) Appl. No.: 17/096,583

(22) Filed: Nov. 12, 2020

(65) Prior Publication Data

US 2021/0165043 A1    Jun. 3, 2021

(30) Foreign Application Priority Data

Nov. 28, 2019    (IT) .......................... 102019000022377

(51) Int. Cl.
*G01R 31/319* (2006.01)
*H03M 1/10* (2006.01)

(52) U.S. Cl.
CPC . *G01R 31/31921* (2013.01); *G01R 31/31922* (2013.01); *H03M 1/109* (2013.01)

(58) Field of Classification Search
CPC ....... G01R 31/31921; G01R 31/31922; H03M 1/12; H03M 1/1095; H03M 1/109
See application file for complete search history.

(56) References Cited

U.S. PATENT DOCUMENTS

| 7,071,852 | B1 | 7/2006 | Wegener |
| 2006/0184687 | A1* | 8/2006 | Fallon .................. H04N 9/8042 |
| | | | 709/231 |
| 2008/0126903 | A1 | 5/2008 | Wegener |
| 2009/0279636 | A1 | 11/2009 | Wang et al. |
| 2012/0324305 | A1* | 12/2012 | Whetsel ................ H05K 1/115 |
| | | | 714/E11.155 |

OTHER PUBLICATIONS

M. S. Sivakumar and S. P. J. V. Rani, "Design of digital built-in self-test for analog to digital converter," 2016 10th International Conference on Intelligent Systems and Control (ISCO), Coimbatore, India, 2016, pp. 1-6. (Year: 2016).*
Sivakumar, Senthil M., et al., "Error Detection of Data Conversion in Flash ADC using Code Width Based Technique", International Conference on Recent Trends in Advanced Computing 2019, Procedia Computer Science, vol. 165, Nov. 12, 2019, pp. 270-277.

* cited by examiner

*Primary Examiner* — Cynthia Britt
(74) *Attorney, Agent, or Firm* — Slater Matsil, LLP

(57) ABSTRACT

A method can be used to test an electronic circuit. The method includes applying a test stimulus signal to the input node, collecting a sequence of N-bit digital test data at the output port. The N-bit digital test data is determined by the test stimulus signal applied to the input node. The method also includes applying N-bit to R-bit lossless compression to the N-bit digital test data to obtain R-bit compressed test data (R is less than N) and making the R-bit compressed test data available in parallel format over R output pins of the circuit.

23 Claims, 2 Drawing Sheets

METHOD OF TESTING ELECTRONIC CIRCUITS AND CORRESPONDING CIRCUIT

CROSS-REFERENCE TO RELATED APPLICATIONS

This application claims the benefit of Italian Application No. 102019000022377, filed on Nov. 28, 2019, which application is hereby incorporated herein by reference.

TECHNICAL FIELD

The description relates to a method of testing electronic circuits and a corresponding circuit.

BACKGROUND

Production tests of electronic components and devices involve evaluating and selecting production samples that meet certain target specifications.

In the case of analog-to-digital converters (ADCs), for instance, two parameters are primarily measured for that purpose: integral non-linearity (INL) and differential non-linearity (DNL). This involves accessing the ADC and controlling (directly) its inputs and reading out the converted samples.

In direct access to the ADC, data are converted serially.

This may not represent an issue when the number of IC (integrated circuit) pins is limited.

In the presence of ADCs with many data bits, for instance, converting serially the output data inevitably increases test times, which in turn translates into an increased cost of testing (and a cost of the final product correspondingly increased).

Also, the presence of a large number of IC pins may lead to a correspondingly large number of ATE (Automatic Test Equipment) being undesirably involved in testing.

SUMMARY

The description relates to testing techniques in electronic circuits. One or more embodiments may be applied, for instance, to analog-to-digital converters.

One or more embodiments can to contribute in overcoming drawbacks discussed in the foregoing.

One or more embodiments may relate to a corresponding circuit, such as a digital-to-analog converter (DAC), for instance.

In one or more embodiments, resorting to a data compression procedure facilitates reducing the number of pins involved in testing a circuit (an analog-to-digital converter, for instance) while keeping the testing time acceptably short.

One or more embodiments may rely on the concept of shifting out the difference between two consecutive samples.

For instance, assuming a[i] is the i-th sample at an output or a circuit being tested (as resulting from conversion to digital in an ADC, for instance) and a[i−1] is the previous sample, the data out (N-bit words) is latched using N flip-flops (FFs) in order to save the (i−1)-th sample, with subtraction with the i-th sample applied.

Reducing the result to three bits (eight possible values) was found to be satisfactory for measuring parameters of interest for an ADC, for instance: the data output of an ADC with 12-bits can be mapped on three pins (in the place of twelve pins) in an ASIC, for instance.

In one or more embodiments, errors (such as, for instance, a sample converted in an ADC turning out to be quite different from the previous one: that is a[i]>>a[i−1] or a[i]<<a[i−1]) can be dealt with a finite state machine (FSM) or control logic configured to enable automatic serial shift of converted data on serial output pins while setting an error flag (error signal high, for instance).

This feature facilitates debugging a block, making it possible to identify the data item that caused the error.

In embodiments applied to testing ADCs, compressing the ADC data and shifting out a reduced number of bits facilitates testing those ADCs which operate with a large number of bits included in a package with reduced number of pins available for testing.

Briefly, one or more embodiments may offer advantages such as: number of bits reduced with respect to direct access, with ensuing increased efficiency; test time reduced with respect to shifting serially the data from the circuit under test (an ADC, for instance); reduced number of IC pins involved in testing; and reduced number of automated testing equipment (ATE) involved in testing.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

Figure 1:
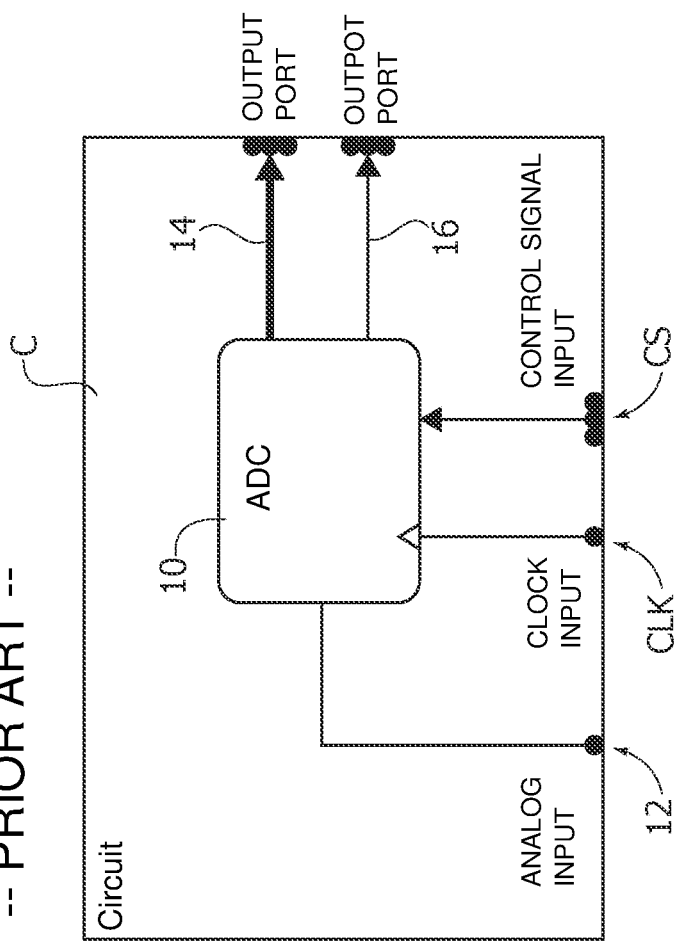
FIG. 1 is exemplary of a conventional approach in testing a circuits such as an analog-to-digital converter or ADC.

In the following description, various specific details are given to provide a thorough understanding of various exemplary embodiments of the present specification. The embodiments may be practiced without one or several specific details, or with other methods, components, materials, etc. In other instances, well-known structures, materials, or operations are not shown or described in detail in order to avoid obscuring various aspects of the embodiments. Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The headings provided herein are for convenience only and therefore do not limit the extent of protection or scope of the embodiments.

Analog-to-digital converters (ADCs) are extensively used in electronics. For instance, ADCs are commonly embedded in System-on-Chip (SoC) arrangements.

As discussed previously, in production tests of ADCs two parameters are primarily measured: integral non-linearity (INL) and differential non-linearity (DNL).

INL provides an evaluation of the linearity of an ADC: that is the digital output code vs. analog input relationship; this is a linear relationship in the case of an ideal ADC and a non-linear (concave or convex) curve in the case of a real ADC.

DNL provides an evaluation of the "grade" of non-linearity; an ideal ADC has a DNL equal to one LSB (least significant bit): that is, each conversion step is exactly equal to one LSB.

Both INL and DNL can be evaluated (computed) in different ways, starting from the converted digital output from the ADC. In the case of tests performed on an ADC included in a SoC, this conventionally involves a direct access to the block which controls the signals to start the conversion and observing the data bus of the converted input.

This may lead to some limitations in the case of ADCs with a certain amount of data bits (data words with 12 bits or more, for instance) and/or in the case of packages having a reduced number of pins available for testing purposes. These conditions militate against the ability of testing a circuit block in a short time (milliseconds, for instance).

One or more embodiments may address these issues by resorting to data compression, with the capability of "saving" several pins without adversely affecting test times and data accuracy.

A conventional approach in testing an ADC is to shift out the digital data as converted over N-bits. This can be done in parallel, when many pins are available; or serially, by converting the ADC data out with a parallel-to-serial circuit.

During testing, the ADC block (in a SoC, for instance) is directly accessed, the ADC is fed with an analog input signal to be converted, and the converted data output is read. The INL and DNL behavior of the ADC block can be analyzed by feeding the ADC with an analog ramp or sinusoidal signal (stimulus signal).

Such an approach is exemplified in FIG. 1, where the component under test (an ADC included in a circuit C such as an application specific integrated circuit or ASIC) is designated 10.

In FIG. 1, reference 12 denotes an analog input to the ADC 10, whose operation is clocked via clock signal applied at an input designated CLK and controlled (in a manner known to those of skill in the art) via control signals applied at a control input CS (over P pins, for instance).

Output data converted to digital are available at an output port 14 (over N pins, with N=12, for instance) with data validation signals of the data available at an output 16 (over M pins, for instance).

In an arrangement as exemplified in FIG. 1, the analog input 12, the clock and control inputs CLK and CS as well as the outputs 14 and 16 (some of them being multi-pin inputs) are assumed to be directly accessible from outside the circuit C.

As discussed previously, such an approach is advantageous insofar as it can exploit direct control of the block.

Such approach otherwise relies on the availability (accessibility) of a large number of pins for testing purposes. It is noted that a circuit such as an ASIC as exemplified herein may not have so many test resources available.

An alternative approach may involve shifting out serially the data converted: this in turn may lead to an undesirable increase in testing time.

Figure 2:
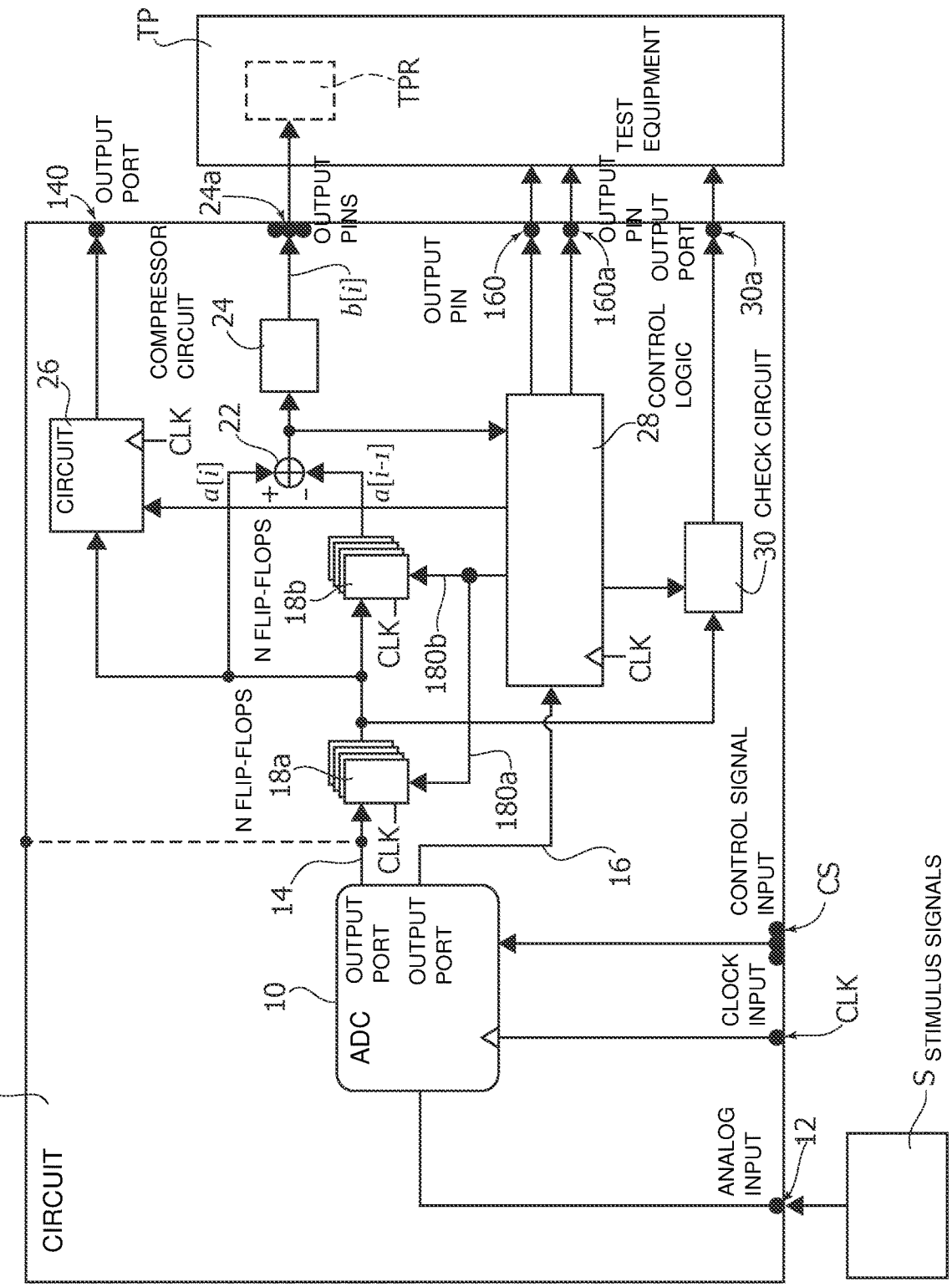
FIG. 2 is exemplary of testing a circuit such as an analog-to-digital converter or ADC according to embodiments as illustrated in the description.

One or more embodiments as exemplified in FIG. 2 rely on a data compression procedure in order to reduce the number of pins used for testing while maintaining test time reasonably short without introducing any data loss related to data compression.

In FIG. 2, parts or elements like parts or elements already discussed in connection with FIG. 1 are indicated with like references. Consequently, a detailed description of these parts or elements will not be repeated for brevity.

The basic idea underlying one or more embodiments as exemplified in FIG. 2 is to shift out—in the place of the digital output samples per se—the difference between two consecutive samples.

For instance, assuming a[i] is the i-th sample (N-bit data word) resulting from data conversion and a[i−1] is the previous one, one or more embodiments as exemplified in FIG. 2 may be based on the concept of shifting out, rather than the sequence . . . a[i−1], a[i], . . . , the sequence of differences between subsequent (adjacent) samples, namely:

$$b_{i-1} = a[i] - a[i-1]$$

Starting from the beginning, one will have:

$$b_0 = a[1] - a[0]$$

$$b_1 = a[2] - a[1]$$

$$b_2 = a[3] - a[2]$$

. . .

and so on.

Assuming that the first sample a[o] is known to be zero, the ADC data (that are the a[i]) will be reconstructed as:

$$b_0 = a[1]$$

$$b_1 + b_0 = a[2] - a[1] + a[1] - a[0] = a[2] - a[0] = a[2]$$

$$b_2 + b_1 + b_0 = a[3] - a[2] + a[2] - a[1] + a[1] - a[0] = a[3] - a[0] = a[3]$$

That is:

$$a[s] = \sum_{i=1}^{s} b_{i-1}$$

under the condition: a[0]=0

In case this condition is not met, information as to the first data sample converted can be added so that the other samples can be expressed as:

$$a[s] = \sum_{i=1}^{s} b_{i-1} + a[0]$$

It will be appreciated that data bit compression as exemplified herein is essentially loss-less. That is, the compressed data $b_i$ retain the full information of the original uncompressed data $a_i$ so that the uncompressed data can be reconstructed from the compressed data with no information lost.

The block diagram of FIG. 2 illustrates a possible (simple) hardware implementation of such a simple data compression procedure, where the data (N-bits) output from the circuit 10 (an ADC for example) over the (N-pin) output port 14 are latched using two banks of flip-flops each including of N flip-flops, namely 18a (data 0) and 18b (data 1) clocked by the clock signal CLK, in order to save the (i−1)-th and i-th samples, with i being a generic index evolving over time. These samples are (mutually) subtracted in order to compute $b_{i-1}$ as per the formulas discussed in the foregoing.

For the sake of simplicity and ease of explanation, the exemplary case where the analog input signal applied at 12 and used for testing an ADC 10 is a ramp can be considered. Such an analog input should notionally lead to all the symbols of the ADC being "scanned", with the difference between two adjacent samples theoretically equal to one.

As discussed previously, a target in testing an ADC may be represented by measuring the linearity parameters (INL and DNL) and check if and how they differ from the ideal value.

Under circumstances as considered herein (by way of example, of course), shifting out—in the place of the digital output samples per se—the difference between two consecutive samples (that is between two N-bit data words) may facilitate reducing the result to R bits, with R less than N.

For instance, selecting R=3, that is three bits amounts to eight possible values, was found to be enough for measuring parameters of interest such as, for instance, INL and DNL in a 12-bit ADC, that is with N=12.

In that way, the data output—over 12 bits—by an ADC (at 14 in FIG. 2, for instance) can be mapped on three pins (for instance) of the ASIC so that three pins instead to twelve pins can be used for testing purposes.

Operation of a circuit as exemplified in FIG. 2 may be coordinated by a control logic 28 which may be configured, for instance, as a finite state machine (FSM) capable of managing the data flow, checking the results of difference, indicating codes possibly "missing" as may be the case of a real ADC.

To that effect the data (N-bits) latched using the two banks of N flip-flops 18a (data 0) and 18b (data 1) clocked by the clock signal CLK, are forwarded to respective "+" and "−" of an adder node 22. This may occur under the control of two "enable shift" signals sent over lines 180a and 180b from the control logic 28 (FSM, for instance).

In that way, at each i-th (sampling) time ... i−1, 1, i+1, ..., samples a[i] and a[i−1] are made available at the inputs (+ and −, respectively) with opposed signs of the adder node 22, which in fact acts as a subtraction node which makes the difference a[i]−a[i−1] available to a compressor circuit 24 which—for instance based on the "differential" relationships discussed in the foregoing—reduces the N+1 bit words from the node 22 to R bit data words are made available at a set of R pins 24a.

Referring to N+1 bits coming out from the node 22 takes onto account the fact (known to those of skill in the art) that a risk of saturating an adder logic may arise when adding two samples with N bits, and using an adder with N+1 bit size facilitates managing saturation: for instance a saturated result may lead to a possible error which can be managed by the circuit 28 (a FSM, for instance).

As exemplified in FIG. 2, the N-bit data latched using the two banks of flip-flops 18a and 18b are otherwise forwarded to a (serial) circuit 26 for possible serial output from the ASIC C at a port 140.

As exemplified in dashed lines in FIG. 2, the circuit C may still retain the possibility of outputting serially the N-bit conversion data a[i] from the output port 14 of the ADC 10, without compression, for instance for operation after favorable testing.

The control logic 28 may supervise operation of a (small) check circuit 30 where a check is made as to whether the first sample a[o] is zero, and possibly shifts it out it at an output port 30a. This arrangement may also implement a "backdoor" that can be used for debugging and for validating the procedure insofar as the same logic circuit configured to shift out a[o] can also be used to shift out the raw samples a[i] output at 14.

As discussed, in one or more embodiments, during testing of an ADC, for instance, all the possible output codes can be generated (using an analog ramp signal as a stimulus).

Assuming a 12-bit ADC is considered as the circuit 10, thus results in 4096 samples.

With a conventional approach as exemplified in FIG. 1, the total number of bits shifted out (serially or parallel) with 12 bits per sample amounts to:

4096×12=49152 bits

With an approach as exemplified in FIG. 2 and assuming just 3 bits per sample, that figure reduces to:

12+(4095×3)=12297 bits

That is, assuming the 12 bits related to the first sample a[o] are shifted out (possibly, that is in case a[o] is non-zero), then 4095 next samples (only) will have to follow. This amounts to a 4× increased efficiency in terms of overall efficiency in testing a 12-bit ADC.

In the context considered herein, efficiency E can be definite as the ratio of the (overall) number of ADC bits (N) and the number of bits shifted out (R).

efficiency=Number of ADC bits/R

In case of errors (for instance, a converted data item much different from the previous one a[i]>> a[i−1] or a[i]<<a[i−1], that is in the presence of a difference between two adjacent N-bit digital data samples in excess of a difference threshold), the control logic 28 may automatically enable the (serial) shift of converted data on a serial output pin 160, while also setting an error flag (error signal=high, for instance) at a pin 160A. This feature will facilitate block debugging by making available the data that caused the error.

One or more embodiments may thus provide an alternative approach for testing a circuit such as, for instance, an ADC block: this technique facilitates reducing the number of pins involved in circuit testing, without adversely affecting data accuracy and test time.

A simple logic circuitry comprising a N+1 bit adder (with sign, see integer 22 in FIG. 2, for instance), where N is the number of ADC bits, two banks of N FFs for data latching and a control FSM, may facilitate reducing the number of test pins involved in testing.

Those of skill in the art will otherwise appreciate that the signals available at the output of a circuit such as the ADC 10 being in digital format may facilitate performing (at least partly) via software the processing here illustrated by referring to distinct physical blocks.

Whatever the implementing options adopted, the advantages of one more embodiments can be particularly appreciated when the number of pins available for testing is (much) smaller than the total number of overall pins of circuit such as the ADC 10.

Moreover, one or more embodiments may lead to improvements of data transferred out as a result of data compression. In exemplary embodiments as illustrated herein, this may be simply expressed as the ratio of the number N of ADC bits to the number R of data output bits obtained by compression.

During testing of a circuit such as 10 a stimulus signal (an analog ramp or sinusoidal signal, for instance) can be injected into the input node 12 so that a corresponding N-bit output signal (N-bit digital converted data, in the exemplary case of an ADC) can be collected at 14; N-bit to R-bit data compression processing as discussed previously can be applied to that output signal so that compressed (R-bit) data can be made available at the output 24a for use in test processing by test equipment TP.

Test processing may involve testing INL and DNL behavior of an ADC such as 10, for instance. Test equipment TP as exemplified herein may comprise a conventional ATE configured to perform testing as desired.

In that respect, it will be appreciated that one or more embodiments are largely "transparent" to the type of circuit tested and the type of testing performed thereon.

In fact, one or more embodiments can be generally applied to testing electronic circuits configured to produce a sequence of N-bit digital data at an output port as a result of signals applied to an input node.

Reference to testing INL and DNL behavior of an ADC such as 10 is thus merely exemplary and not limiting of embodiments. One or more embodiments are in fact primarily concerned with the generation of (R-bit, for instance) compressed data for testing rather than on the very nature of these data and/or test processing performed thereon.

For instance, in the exemplary case of an ADC, once test samples are made available at TP, a wide variety of procedures known to those of skill in the art can be implemented in order to extract ADC parameter for testing purposes.

It is otherwise noted that compression as discussed herein may benefit from stimulus signals S (as applied at 12, for instance), such as a ramp or sinusoidal signal, which evolve "slowly" over time.

One or more embodiments lend themselves to being used with test equipment such as TP comprising conventional ATE supplemented with de-compressor circuitry and/or SW code—generally indicated as TPR in FIG. 2—configured to apply (in a complementary manner) the compression relationships implemented at 18*a*, 18*b*, 22 and 24) in order to reconstruct—starting from the compressed data b[i] (R-bit, for instance) collected at 24*a*—the original uncompressed data a[i] (N-bit, for instance) for use in testing.

Processing at TP/TPR may take into account the information received from the control logic 28 and the circuit 30 and/or take steps in compliance with the management policy of large errors (a[i]>>>a[i−1] or a[i]<<a[i−1]) implemented at 28 as discussed previously.

Also, while one or more embodiments facilitate easy de-compression of the compressed data b[i], at least in certain circumstances, otherwise conventional test processing at TP may be adapted in order to operate on compressed data b[i], thus dispensing—at least partly—with de-compression to uncompressed data a[i].

As exemplified herein, a method of testing an electronic circuit (for instance and ASIC C including an analog-to-digital converter, 10) configured to produce a sequence of N-bit digital data (that is, a sequence of digital samples, each sample over N bits, namely having a word length of N bits) at an output port (for instance, 14) as a result of signals applied to an input node (for instance, 12), may comprise:

applying a test stimulus signal (for instance, S) to the input node, collecting at the output port a sequence of N-bit digital test data (for instance, a[i], a[i−1]) resulting from the test stimulus signal applied to the input node, applying to the N-bit digital test data collected at the output port N-bit to R-bit lossless compression (for instance, 18*a*, 18*b*, 22, 24) to obtain R-bit compressed test data (that is, digital samples, each sample over R bits, namely having a word length of R bits, for instance, b[i]), wherein R is less than N, and making the R-bit compressed test data available in parallel format over R output pins (for instance, 24*a*) of the circuit (w).

A method as exemplified herein may comprise collecting the R-bit compressed test data at the R output pins of the circuit, reconstructing (for instance, TP) the N-bit digital test data from the R-bit compressed test data, and performing the testing on the N-bit digital test data reconstructed from the R-bit compressed test data.

In a method as exemplified herein, the N-bit to R-bit lossless compression may calculating the R-bit compressed test data as differences (for instance, 22) between subsequent (adjacent) N-bit digital data samples (for instance, a[i], a[i−1]) in the sequence of N-bit digital test data.

In a method as exemplified herein, the N-bit to R-bit lossless compression may comprises checking (for instance, at 28) the differences between subsequent N-bit digital data samples in the sequence of N-bit digital test data, wherein the method may comprise at least one of:

setting an error flag (for instance, 160*a*) in the presence of a difference between subsequent N-bit digital data samples in the sequence of N-bit digital data samples in excess of a difference threshold (for instance such that a[i]>>a[i−1] or a[i]<<a[i−1], as determined, for instance via comparison in logic or FSM 28), and/or outputting (for instance, 160) at least one of subsequent N-bit digital data samples (for instance one of a[i], a[i−1] for which a[i]>>a[i−1] or a[i]<<a[i−1]) in the sequence of N-bit digital data samples producing a difference between subsequent N-bit digital data samples in the sequence of N-bit digital data samples in excess of a difference threshold.

A method as exemplified herein may comprise selecting the stimulus signal out of a ramp and a sinusoidal signal and/or selecting N and R equal to 12 and 3, respectively.

As exemplified herein, the electronic circuit may comprise an analog-to-digital converter circuit (for instance, 10) and the testing (for instance, TP) may optionally comprise testing at least one of the integral non-linearity, INL, behavior and differential non-linearity, DNL, behavior of the analog-to-digital converter circuit (10).

A circuit (for instance, C) as exemplified herein may comprise an input node and an output port. The circuit is configured to produce a sequence of N-bit digital test data at the output port as a result of a stimulus signal applied to the input node. N-bit to R-bit lossless compression circuitry is coupled to the output port, the compression circuitry configured to apply to N-bit digital test data at the output port N-bit to R-bit lossless compression to obtain therefrom R-bit compressed test data, wherein R is less than N. A number R of output pins of the circuit are coupled to N-bit to R-bit lossless compression circuitry to receive therefrom the R-bit compressed test data in parallel format.

In a circuit as exemplified herein, the N-bit to R-bit lossless compression circuitry may comprise a difference node (for instance, 22) supplied (for instance, via 18*a*, 18*b*) with subsequent (adjacent) N-bit digital data samples in the sequence of N-bit digital test data, wherein the difference node is configured to calculate the R-bit compressed test data as differences between subsequent N-bit digital data samples in the sequence of N-bit digital test data.

A circuit as exemplified herein may comprise control circuitry (for instance, a control logic or a FSM such as 28) coupled to the N-bit to R-bit lossless compression circuitry, the control circuitry (28) configured to perform at least one of:

setting an error flag (for instance, 160*a*) in the presence of a difference between subsequent N-bit digital data samples in the sequence of N-bit digital data samples in excess of a difference threshold, and/or outputting (for instance, 160) at least one of subsequent N-bit digital data samples in the sequence of N-bit digital data samples producing a difference between subsequent N-bit digital data samples in the sequence of N-bit digital data samples in excess of a difference threshold.

In a circuit as exemplified herein the electronic circuit may comprise an analog-to-digital converter circuit (for instance, 10) configured to receive at the input node a stimulus signal out of a ramp and a sinusoidal signal, and/or N and R may be equal to 12 and 3, respectively.

The details and embodiments may vary with respect to what has been disclosed herein and merely by way of example without departing from the extent of protection.

The extent of protection is determined by the annexed claims.

What is claimed is:

1. A method of testing an electronic circuit configured to produce a sequence of N-bit digital data at an output port as a result of signals applied to an input node, the method comprising:
    applying a test stimulus signal to the input node;
    collecting a sequence of N-bit digital test data at the output port, the N-bit digital test data determined by the test stimulus signal applied to the input node;
    applying N-bit to R-bit lossless compression to the N-bit digital test data to obtain R-bit compressed test data, wherein R is less than N; and
    making the R-bit compressed test data available in parallel format over R output pins of the electronic circuit.

2. The method of claim 1, further comprising:
    receiving the R-bit compressed test data from the R output pins of the electronic circuit;
    reconstructing the N-bit digital test data from the R-bit compressed test data; and
    performing the testing on the N-bit digital test data reconstructed from the R-bit compressed test data.

3. The method of claim 1, wherein the N-bit to R-bit lossless compression comprises calculating the R-bit compressed test data as differences between subsequent N-bit digital data samples in the sequence of N-bit digital test data.

4. The method of claim 3, wherein the N-bit to R-bit lossless compression comprises checking the differences between subsequent N-bit digital data samples in the sequence of N-bit digital test data, wherein the method comprises setting an error flag in the presence of a difference between subsequent N-bit digital data samples in the sequence of N-bit digital data samples in excess of a difference threshold.

5. The method of claim 3, wherein the N-bit to R-bit lossless compression comprises checking the differences between subsequent N-bit digital data samples in the sequence of N-bit digital test data, wherein the method comprises outputting at least one of subsequent N-bit digital data samples in the sequence of N-bit digital data samples producing a difference between subsequent N-bit digital data samples in the sequence of N-bit digital data samples in excess of a difference threshold.

6. The method of claim 1, wherein the test stimulus signal is a ramp signal.

7. The method of claim 1, wherein the test stimulus signal is a sinusoidal signal.

8. The method of claim 1, wherein N is equal to 12 and R is equal to 3.

9. The method of claim 1, wherein the method comprises a method of testing an analog-to-digital converter circuit.

10. The method of claim 9, wherein the testing comprises testing integral non-linearity behavior of the analog-to-digital converter circuit.

11. The method of claim 9, wherein the testing comprises testing differential non-linearity behavior of the analog-to-digital converter circuit.

12. A method of testing an electronic circuit, the method comprising:
    applying a test stimulus signal to an input node of the electronic circuit;
    receiving R-bit compressed test data from R output pins of the electronic circuit, where R is a real number;
    reconstructing N-bit digital test data from the R-bit compressed test data, wherein N is a real number greater than R; and
    performing the testing on the N-bit digital test data that was reconstructed from the R-bit compressed test data.

13. The method of claim 12, wherein the electronic circuit comprises an analog-to-digital converter circuit, the method further comprising:
    determining, by the analog-to-digital converter circuit, a sequence of N-bit digital test data based on the test stimulus signal;
    applying N-bit to R-bit lossless compression to the N-bit digital test data to obtain the R-bit compressed test data; and
    providing the R-bit compressed test data in parallel format to the R output pins, wherein the testing is performed outside of the analog-to-digital converter circuit.

14. The method of claim 13, wherein the test stimulus signal is a ramp signal or a sinusoidal signal.

15. The method of claim 13, wherein N is equal to 12 and R is equal to 3.

16. The method of claim 13, wherein the testing comprises testing integral non-linearity behavior of the analog-to-digital converter circuit or testing differential non-linearity behavior of the analog-to-digital converter circuit.

17. A first circuit comprising:
    a second circuit configured to produce a sequence of N-bit digital test data at an output port of the second circuit in response to a stimulus signal applied to an input node of the second circuit;
    compression circuitry coupled to the output port of the second circuit, the compression circuitry configured to apply N-bit to R-bit lossless compression to N-bit digital test data at the output port to obtain therefrom R-bit compressed test data, wherein R is less than N; and
    a plurality of R output pins coupled to the compression circuitry to receive therefrom the R-bit compressed test data in parallel format.

18. The first circuit of claim 17, wherein the compression circuitry comprises a difference node supplied with subsequent N-bit digital data samples in the sequence of N-bit digital test data, wherein the difference node is configured to calculate the R-bit compressed test data as differences between subsequent N-bit digital data samples in the sequence of N-bit digital test data.

19. The first circuit of claim 18, comprising control circuitry coupled to the compression circuitry, the control circuitry configured to set an error flag in the presence of a difference between subsequent N-bit digital data samples in the sequence of N-bit digital data samples in excess of a difference threshold.

20. The first circuit of claim 18, comprising control circuitry coupled to the compression circuitry, the control circuitry configured to output at least one of subsequent N-bit digital data samples in the sequence of N-bit digital data samples producing a difference between subsequent N-bit digital data samples in the sequence of N-bit digital data samples in excess of a difference threshold.

21. The first circuit of claim 17, wherein the second circuit is an analog-to-digital converter circuit configured to receive at the input node a stimulus signal out of a ramp signal.

22. The first circuit of claim 17, wherein the second circuit is an analog-to-digital converter circuit configured to receive at the input node a stimulus signal out of a sinusoidal signal.

23. The first circuit of claim 17, wherein N is equal to 12 and R is equal to 3.

* * * * *